United States Patent [19]

Sakurai et al.

[11] Patent Number: 5,388,460

[45] Date of Patent: Feb. 14, 1995

[54] CAPACITIVE SENSOR FOR DETECTING A PHYSICAL VALUE SUCH AS ACCELERATION

[75] Inventors: Shizuki Sakurai, Nagoya; Shiro Kuwahara, Anjo; Nakane Kunie, Kariya; Ryota Takagi, Hamamatsu, all of Japan

[73] Assignee: Toyoda Koki Kabushiki Kaisha, Kariya, Japan

[21] Appl. No.: 853,292

[22] Filed: Mar. 18, 1992

[30] Foreign Application Priority Data

Mar. 27, 1991 [JP] Japan .................... 3-090037

[51] Int. Cl.[6] .......................................... G01P 15/11
[52] U.S. Cl. ............................................... 73/517 R
[58] Field of Search .......... 73/517 R, 517 B, 862.626, 73/718, 724; 361/280, 283.4

[56] References Cited

U.S. PATENT DOCUMENTS

| | | | |
|---|---|---|---|
| 4,644,798 | 2/1987 | Tamura | 73/718 X |
| 5,134,887 | 8/1992 | Bell | 73/718 |
| 5,195,371 | 3/1993 | Greiff | 73/518 B X |

*Primary Examiner*—Hezron E. Williams
*Assistant Examiner*—Christine K. Oda
*Attorney, Agent, or Firm*—Oblon, Spivak, McClelland, Maier & Neustadt

[57] ABSTRACT

A capacitive acceleration sensor is composed of a silicon plate, a glass plate and a substrate. The silicon plate has a fixed portion and a movable portion supported by the fixed portion through spring beams. The movable portion is moved in response to the change in the acceleration and is provided with a moving electrode thereon. The glass plate is provided with a fixed electrode and anodically bonded to the silicon plate so that the fixed electrode faces the moving electrode with a predetermined gap. On the glass plate, a first dummy electrode is formed at a location corresponding to the spring beams of the silicon plate. The dummy electrode has a terminal portion at one end so as to be electrically connected with the silicon plate during anodic bonding of the plates. On the substrate, a second dummy electrode is formed at a location corresponding to the movable portion of the silicon plate. The dummy electrode, similarly, has a terminal portion at one end so as to be electrically connected with the silicon plate during anodic bonding of the silicon plate and the substrate.

6 Claims, 4 Drawing Sheets

CAPACITIVE SENSOR FOR DETECTING A PHYSICAL VALUE SUCH AS ACCELERATION

BACKGROUND OF THE INVENTION

1. Field of the Invention

The present invention relates to a capacitive sensor for detecting a physical value such as acceleration, and more particularly to a capacitive sensor in which a pair of plates having electrodes are bonded to each other by an anodic bonding method.

2. Discussion of the Prior Art

A capacitive acceleration sensor is composed of a pair of plates each having an electrode. The first plate has a fixed portion and a movable portion on the latter of which a moving electrode is formed. The second plate has a fixed electrode. The two plates are anodically bonded to each other so that two electrodes faces with a predetermined gap.

In such sensor, a plurality of spring beams are formed between the fixed portion and the movable portion of the first plate so that the movable portion is supported by the fixed portion through the spring beams. Namely, one end of each spring beam is connected to the movable portion and the other end of each spring beam is connected to the fixed portion.

When an acceleration is applied to the capacitive acceleration sensor, the spring beams deflects toward the second plate to change the gap between the moving electrode and the fixed electrode. Therefore, the capacitive acceleration sensor can detect the acceleration by measuring the change in the gap between two electrodes i.e. the change in capacitance C between two electrodes. The capacitance C is generally expressed as follows:

$$C = \epsilon S/d$$

where, $\epsilon$ is a dielectric constant, S is the area of the electrodes and d is the gap between the electrodes.

When both of the plates are anodically bonded to each other, an electrostatic force Pe is generated therebetween. This electrostatic force Pe is derived as follows:

$$Pe = \epsilon S V^2 / 2d^2$$

where, $\epsilon$ is a dielectric constant, S is the area of the electrodes, V is a voltage applied to the electrodes and d is the gap between the electrodes.

The above equation means that the electrostatic force Pe increases in proportion to the squared value of the voltage V which is applied between the plates for anodically bonding them. When a electrostatic force Pe acts between the plates, the spring beams deflects toward the second plate and finally sticks thereto because the spring beams are very flexible.

The above-described capacitive acceleration sensor has a three-stratum structure. Namely a first plate made of silicon is placed on a substrate made of glass, and a second plate made of glass is then placed on the first plate. These substrate and first and second plates are anodically bonded as follows.

At first, a voltage of 800 V is applied between the first plate and the second plate to anodically bond them. During this fabrication process, the charge stored on the surfaces of both plates generates a great electrostatic force Pe therebetween. The spring beams formed on the first plate then sticks to the surface of the second plate facing the first plate. In this state, the gap between the electrodes does not change even when an acceleration is applied to the capacitive acceleration sensor thereby making it impossible to detect acceleration.

Further, a voltage of 900 V applied between the first plate and the substrate to anodically bond them. During this fabrication process, the charge stored on the surfaces of the first plate and the substrate also generates a great electrostatic force Pe therebetween. A weighted portion suspended with the moving electrode then sticks to the surface of the substrate facing the first plate. In this state, similarly, it becomes impossible to detect acceleration.

SUMMARY OF THE INVENTION

Accordingly, it is a primary object of the present invention to provide an improved capacitive sensor for detecting a physical value such as acceleration which sensor is able to properly operate after assembling.

It is another object of the present invention to provide an improved capacitive sensor which is capable of preventing the spring beams and/or moving electrode from sticking to an adjacent surface or surfaces due to electrostatic force generated during anodic bonding process.

A capacitive sensor according to the present invention comprises a pair of plates. The first one has a fixed portion and a movable portion supported by the fixed portion through spring beams. The movable portion acts as a weighted portion and is provided with a moving electrode thereon. Therefore, the movable portion moves in response to the change in the physical value. On the other hand, the second one is provided with a fixed electrode and is anodically bonded to the first plate so that the fixed electrode faces the moving electrode with a predetermined gap. Further, a substrate may be anodically bonded to the first plate.

In addition to the above-described structure, the capacitive sensor according to the present invention is provided with a dummy electrode. The dummy electrode is formed on the second plate at a location corresponding to the spring beams formed on the first plate and is electrically connected to the first plate.

When the plates are anodically bonded, the spring beams formed on the first plate have the same electrical potential as the dummy electrode formed on the second plate so that any electrostatic force is not generated therebetween. This prevents the spring beams formed on the first plate from sticking to the surface of the second plate facing the first plate even when an electrostatic force is generated. As a result, the capacitive sensor according to the present invention can detect physical values such as acceleration accurately after assembling.

BRIEF DESCRIPTION OF THE ACCOMPANYING DRAWINGS

Various other objects, features and many of the attendant advantages of the present invention will be readily appreciated as the same becomes better understood by reference to the following detailed description of the preferred embodiment when considered in connection with the accompanying drawings, in which.

DETAILED DESCRIPTION OF THE PREFERRED EMBODIMENT

Figure 1:
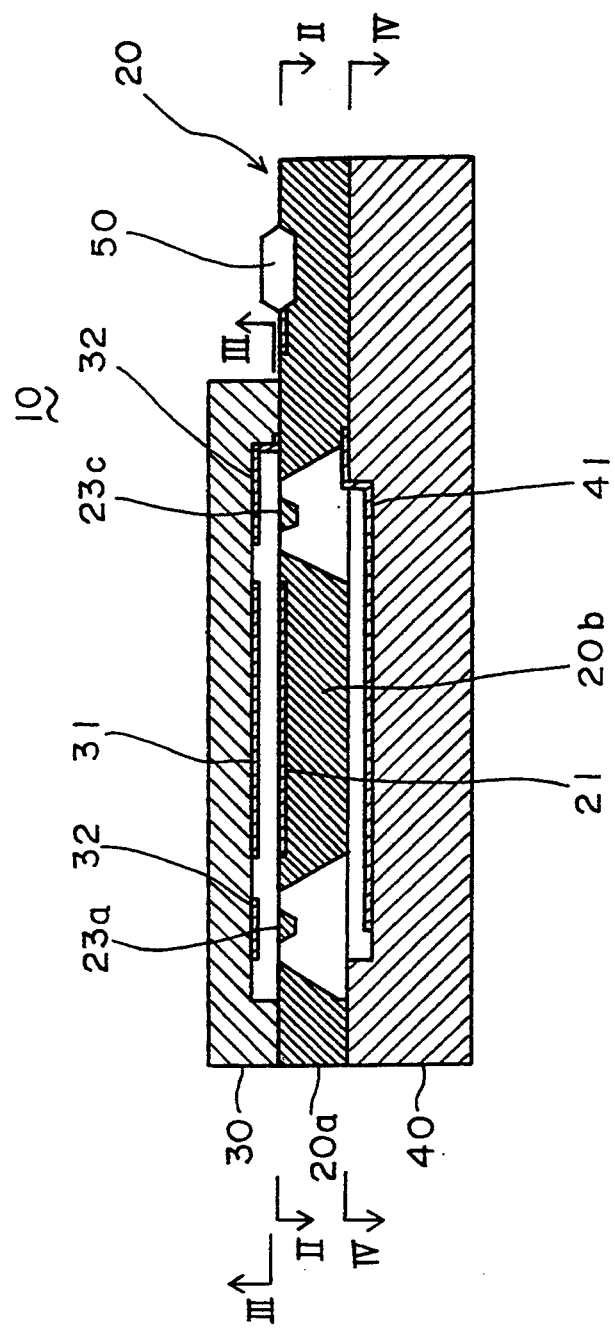
FIG. 1 is a vertical sectional view of a capacitive acceleration sensor embodying the present invention.

Referring now to the drawings, FIG. 1 shows a vertical sectional view of a capacitive acceleration sensor 10 according to the present invention. The capacitive acceleration sensor 10 is mainly composed of a substrate 40 made of glass, a silicon plate (first plate) 20 and a glass plate (second plate) 30. The silicon plate 20 is placed on the substrate 40, while the glass plate 30 is placed on the silicon plate 20.

The silicon plate 20 has a fixed portion 20a and a movable portion 20b which is provided at its upper surface with a moving electrode 21, while the glass plate 30 is provided with a fixed electrode 31. The glass plate 30 is anodically bonded to the silicon plate 20 so that the fixed electrode 31 faces the moving electrode 21 with a predetermined gap. Further, the substrate 40 is anodically bonded to the silicon plate 20.

Spring beams 23a, 23b, 23c and 23d are formed between the fixed portion 20a and the movable portion 20b of the silicon plate 20. The movable portion 20b is supported by the fixed portion 20a through the spring beams 23a, 23b, 23c and 23d. Namely, one end of each spring beam is connected to the movable portion 20b and the other end of each spring beam is connected to the fixed portion 20a.

Phosphorus is diffused as an impurity into the upper surface portion of the silicon plate 20 in order to form the moving electrode 21 thereon. The movable portion 20b constitutes a square weighted portion which moves in response to an acceleration. On the other hand, metal such as aluminum is deposited by a vapor-deposition process on the lower surface portion of the glass plate 30 in order to form the fixed electrode 31 thereon. The movable portion 20b and the spring beams 23a, 23b, 23c and 23d are formed by etching the silicon plate 20 so as to form through grooves each opening to both sides of the silicone plate.

Figure 2:
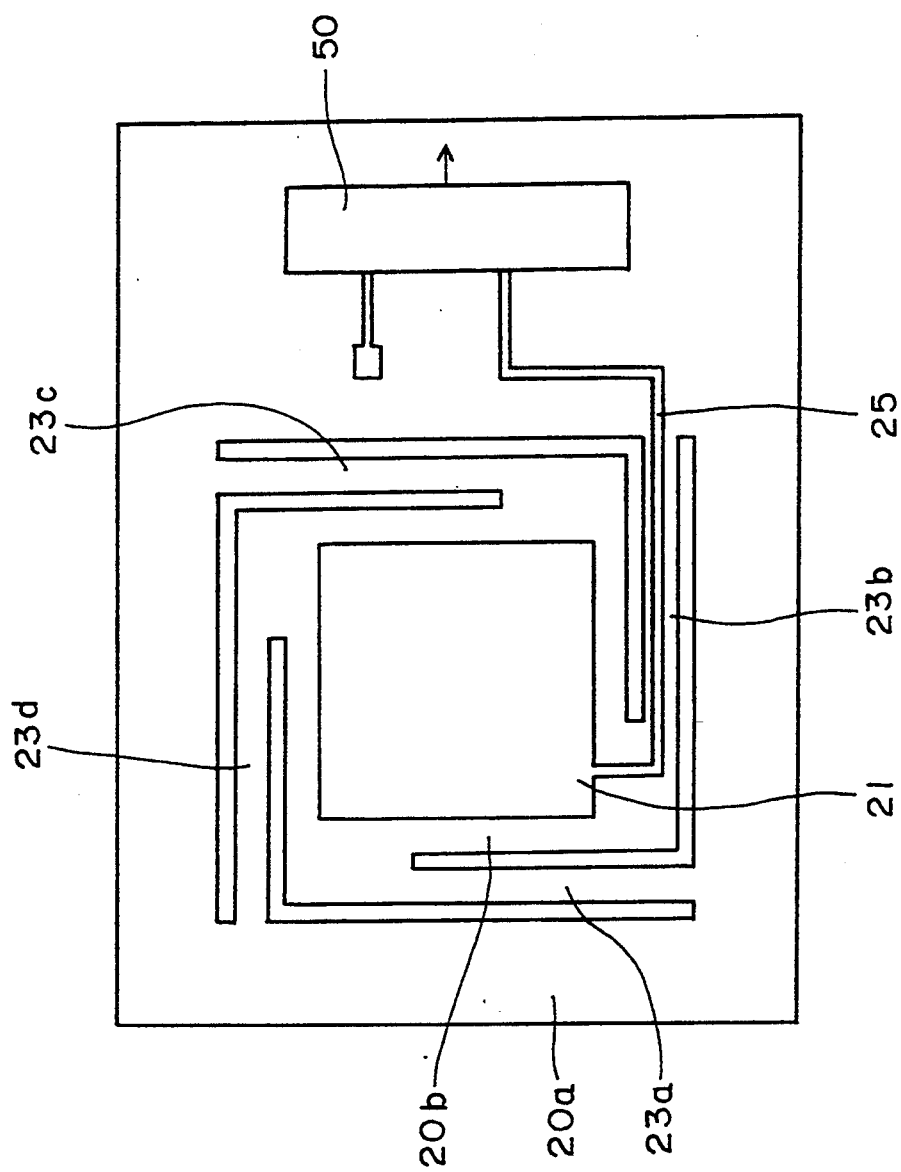
FIG. 2 is a sectional view taken along line II—II of FIG. 1.

An integrated circuit 50 including a CMOS circuit is mounted on the upper surface of the silicon plate 20 at a location which is not occupied by the glass plate 30. On the upper surface of the silicon plate 20, a distribution line 25 is arranged to electrically connect the integrated circuit 50 with the moving electrode 21, as illustrated in FIG. 2.

Figure 3:
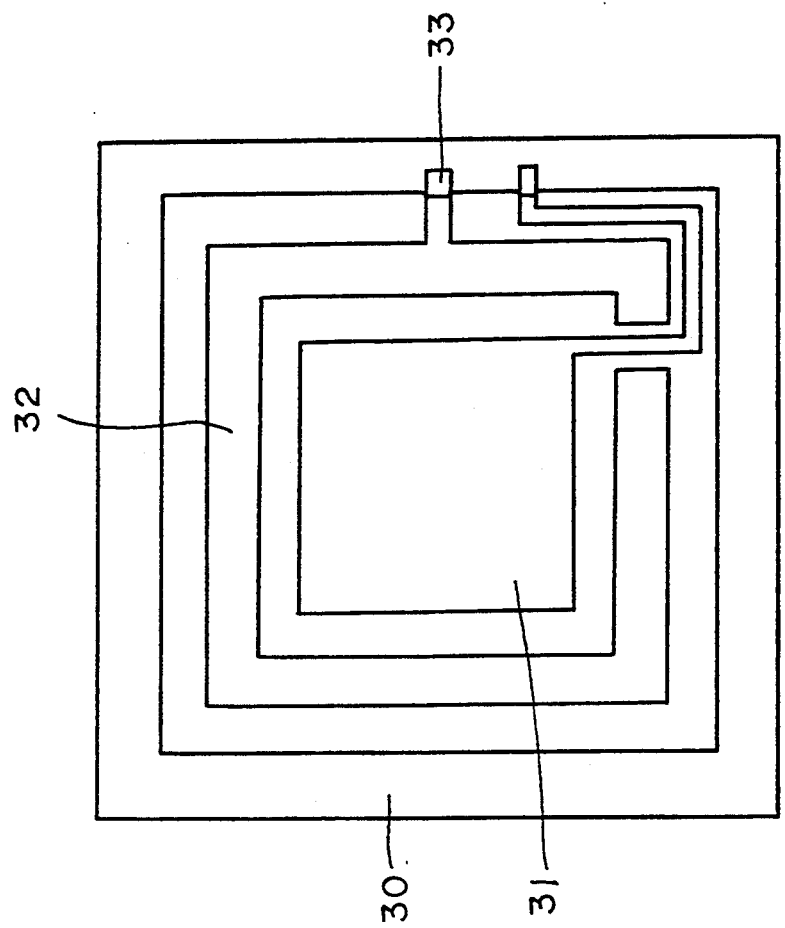
FIG. 3 is a sectional view taken along line III—III of FIG. 1.
Figure 4:
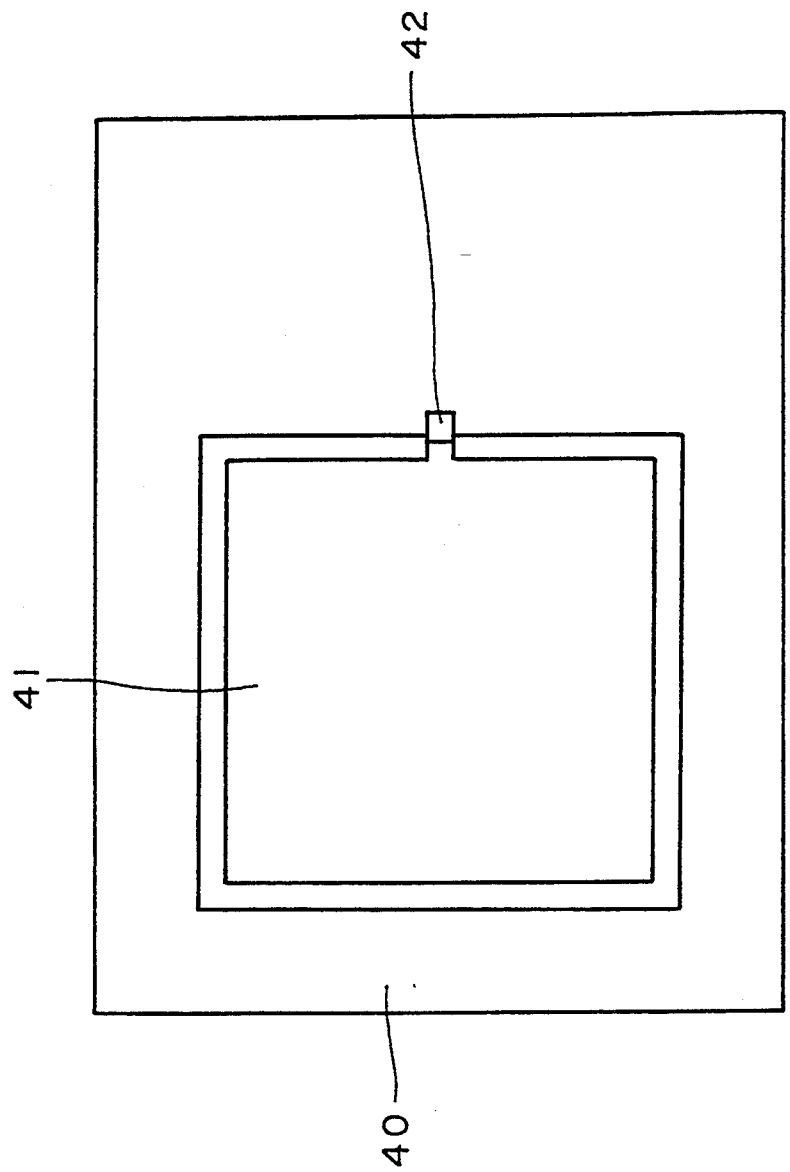
FIG. 4 is a sectional view taken along line IV—IV of FIG. 1.

The capacitive acceleration sensor 10 of the invention is further provided with a pair of dummy electrodes. On the lower surface of the glass plate 30 a first dummy electrode 32 is formed at a location corresponding to the spring beams 23a, 23b, 23c and 23d of the silicon plate 20. The dummy electrode 32 is provided with a terminal portion 33 at one end so as to electrically connect with the silicon plate 20 for potential discharging during anodic bonding, as illustrated in FIG. 3. The second dummy electrode 41 is formed on the upper surface of the substrate 40 at a location facing to the movable portion 20b of the silicon plate 20. The dummy electrode 41 is also provided with a terminal portion 42 at one end to electrically connect with the silicon plate 20 during anodic bonding, as shown in FIG. 4.

The fabrication process for anodic bonding is described hereinafter. At first, a voltage of 800 V is applied between the silicon plate 20 and the glass plate 30. In this state, the beams 23a, 23b, 23c and 23d formed on the silicon plate 20 has the same electrical potential as the dummy electrode 32 formed on the glass plate 30, because the dummy electrode 32 is electrically connected with the silicon plate 20 via the terminal portion 33. During such anodic bonding, the electrostatic force Pe is thus not generated between the spring beams 23a, 23b, 23c and 23d, and the dummy electrode 32. Accordingly, the spring beams 23a, 23b, 23c, 23d are prevented from sticking to the lower surface of the glass plate 30.

Subsequently, a voltage of 900 V is applied between the silicon plate 20 and the substrate 40. In this state, the movable portion 20b of the silicon plate 20 has the same electrical potential as the dummy electrode 41 of the substrate 40, because the dummy electrode 41 is electrically connected with the silicon plate 20 via the terminal portion 42. The electrostatic force Pe is thus not generated between the movable portion 20b and the dummy electrode 41 even during anodic bonding. As a result, the movable portion 20b is prevented from sticking to the upper surface of the substrate 40. According to the above-described structure, the capacitive acceleration sensor can detect acceleration accurately by detecting the change in capacitance between the plates.

The terminal portion 33 of the dummy electrode 32 should be as small as possible. If the terminal portion 33 is large, the silicon plate 20 and the glass plate 30 tend not to be anodically bonded to each other reliably because of the existence of the terminal portion 33 as resistance to anodic bonding. For the same reason, the terminal portion 42 of the dummy electrode 41 should be as small as possible.

The present invention can be applied to other types of sensors measuring other physical values.

Obviously, numerous modifications and variations of the present invention are possible in light of the above teachings. It is therefore to be understood that within the scope of the appended claims, the present invention may be practiced otherwise than as specifically described herein.

What is claimed is:

1. A capacitive sensor for detecting a physical value, comprising:
a first plate having a fixed portion and a movable portion supported by said fixed portion through a flexible supporting portion, said movable portion being moved in response to a change in said physical value and having a moving electrode thereon;
a second plate having a fixed electrode thereon and anodically bonded to said first plate, said fixed electrode facing said moving electrode with a predetermined gap; and
a dummy electrode formed on said second plate at a location facing said flexible supporting portion, said dummy electrode being electrically connected to said first late, wherein said physical value is detected as a change in capacitance between the plates.

2. The capacitive sensor for detecting a physical value as set forth in claim 1,, wherein;
said movable portion comprises a weighted portion which moves in response to an acceleration, and wherein;
a capacitance between said fixed electrode and said moving electrode changes in accordance with said acceleration.

3. The capacitive sensor for detecting a physical value as set forth in claim 2, wherein;

said first plate is further bonded on a substrate.

4. The capacitive sensor for detecting a physical value as set forth in claim 2 wherein;

the materials of said first plate and said second plate are silicon and glass, respectively.

5. The capacitive sensor for detecting a physical value as set forth in claim 3, wherein;

said weighted portion is square as viewed from a large side of said first plate, and said flexible supporting portion is composed of four beams parallel to the four sides of said weighted portion, each one of said four beams having two ends, one end of each beam being connected to the weighted portion and another end of each beam being connected to the fixed portion of said first plate.

6. The capacitive sensor for detecting a physical value as set forth in claim 3, wherein;

a second dummy electrode is provided on said substrate.

* * * * *